United States Patent
Kim et al.

(10) Patent No.: US 10,037,788 B2
(45) Date of Patent: Jul. 31, 2018

(54) SEMICONDUCTOR DEVICES AND SEMICONDUCTOR SYSTEMS

(71) Applicant: SK hynix Inc., Icheon-si Gyeonggi-do (KR)

(72) Inventors: Jae Il Kim, Yongin-si Gyeonggi-do (KR); Hong Jung Kim, Icheon-si Gyeonggi-do (KR); Dae Suk Kim, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/625,651

(22) Filed: Jun. 16, 2017

(65) Prior Publication Data

US 2018/0040355 A1    Feb. 8, 2018

(30) Foreign Application Priority Data

Aug. 2, 2016   (KR) .................. 10-2016-0098422
Aug. 2, 2016   (KR) .................. 10-2016-0098423

(51) Int. Cl.
| | | |
|---|---|---|
| G11C 7/00 | (2006.01) | |
| G11C 7/20 | (2006.01) | |
| G11C 7/22 | (2006.01) | |
| G11C 7/10 | (2006.01) | |
| G11C 29/50 | (2006.01) | |

(52) U.S. Cl.
CPC .............. G11C 7/20 (2013.01); G11C 7/1084 (2013.01); G11C 7/1087 (2013.01); G11C 7/1096 (2013.01); G11C 7/222 (2013.01); G11C 29/50008 (2013.01)

(58) Field of Classification Search
CPC ....... G11C 7/20; G11C 7/1084; G11C 7/1087; G11C 7/1096; G11C 7/222; G11C 29/50008
USPC ........................................................ 365/193
See application file for complete search history.

(56) References Cited

U.S. PATENT DOCUMENTS

| | | | |
|---|---|---|---|
| 6,975,547 B2 | 12/2005 | Byeon et al. | |
| 7,656,722 B2 | 2/2010 | Song | |
| 8,493,809 B2 | 7/2013 | Lee | |
| 9,449,665 B1* | 9/2016 | Kim | G11C 7/222 |
| 2004/0090242 A1 | 5/2004 | Lee et al. | |
| 2015/0036439 A1 | 2/2015 | Lee | |
| 2016/0071574 A1 | 3/2016 | Hess et al. | |

FOREIGN PATENT DOCUMENTS

| | | |
|---|---|---|
| KR | 20150025782 A | 3/2015 |
| KR | 20160023359 A | 3/2016 |

* cited by examiner

*Primary Examiner* — Huan Hoang
(74) *Attorney, Agent, or Firm* — William Park & Associates Ltd.

(57) ABSTRACT

A semiconductor system may include a first semiconductor device and a second semiconductor device. The first semiconductor device may be configured to output commands and addresses. The first semiconductor device may be configured to output a strobe signal toggled and data after an initialization operation. The second semiconductor device may be configured to start the initialization operation if the commands have a first combination and stores internal data having a predetermined level during a set period of the initialization operation if the commands have a second combination.

27 Claims, 9 Drawing Sheets

SEMICONDUCTOR DEVICES AND SEMICONDUCTOR SYSTEMS

CROSS-REFERENCE TO RELATED APPLICATION

The present application claims priority under 35 U.S.C 119(a) to Korean Application No. 10-2016-0098423, filed on Aug. 2, 2016 and Korean Application No. 10-2016-0098422, filed on Aug. 2, 2016, which are incorporated herein by reference in its entirety.

BACKGROUND

1. Technical Field

Embodiments of the present disclosure may generally relate to semiconductor devices and semiconductor systems and, more particularly, to semiconductor devices relating to an initialization operation and semiconductor systems relating to the same.

2. Related Art

Internal set values of a semiconductor device have to be initialized to have initial values before the semiconductor device operates. Thus, an initialization operation of the semiconductor device may be very important to execute normal operations of the semiconductor device.

A chip such as the semiconductor device having various functions may consist of a plurality of circuits, initial conditions of which are necessarily set to perform correct active operations. The initialization operation for setting the initial conditions has to be performed before the active operations of the chip are performed.

In addition, according to an operation mode, the semiconductor device may store data therein or may output the stored data. For example, if a controller requires to access data stored in the semiconductor device, the semiconductor may perform a read operation to output the data stored in memory cells corresponding to an address received from the controller. In contrast, if the controller requires to store data into the semiconductor device, the semiconductor may perform a write operation to store the data into the memory cells corresponding to an address received from the controller.

SUMMARY

According to an embodiment, a semiconductor system may be provided. The semiconductor system may include a first semiconductor device and a second semiconductor device. The first semiconductor device may be configured to output commands and addresses. The first semiconductor device may be configured to output a strobe signal toggled and data after an initialization operation. The second semiconductor device may be configured to start the initialization operation if the commands have a first combination and stores internal data having a predetermined level during a set period of the initialization operation if the commands have a second combination.

According to an embodiment, a semiconductor device includes a command decoder. The command decoder may be configured to generate a write signal based on commands having a first combination, and may be configured to generate an initialization signal based on commands having a second combination.

According to another embodiment, a semiconductor system may include a first semiconductor device, a second semiconductor device, and a third semiconductor device.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices performing an initialization operation of memory cells and semiconductor systems including the same.

Figure 1:
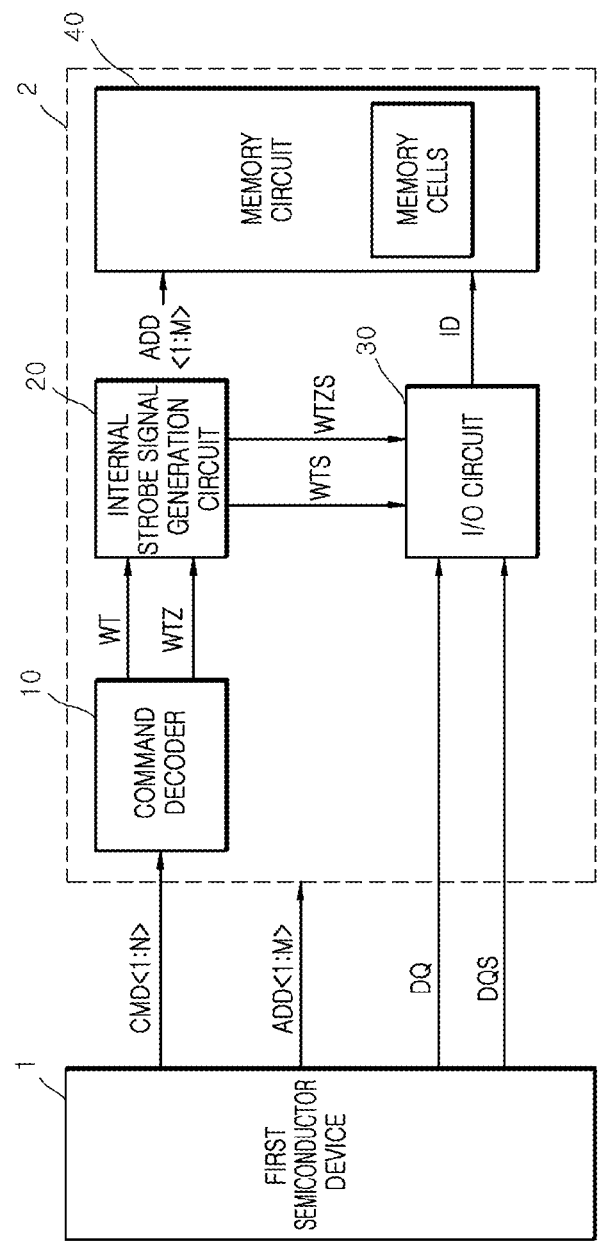
FIG. 1 is a block diagram illustrating a representation of an example of a configuration of a semiconductor system according to an embodiment.

Referring to FIG. 1, a semiconductor system according to an embodiment may include a first semiconductor device 1 and a second semiconductor device 2. The second semiconductor device 2 may include a command decoder 10, an internal strobe signal generation circuit 20, an input/output (I/O) circuit 30 and a memory circuit 40.

The first semiconductor device 1 may output commands CMD<1:N>, addresses ADD<1:M>, data DQ and a strobe signal DQS. The first semiconductor device 1 may output the data DQ after a set period of an initialization operation. The first semiconductor device 1 may output the strobe signal DQS which is toggled after the set period of the initialization operation. The number "N" of bits of the commands CMD<1:N> may be set to be a natural number and may be set to be different according to the embodiments. The number "M" of bits of the addresses ADD<1:M> may be set to be a natural number and may be set to be different according to the embodiments. Although FIG. 1 illustrates the data DQ line with a single signal line, the data DQ may be set to include a plurality of bits according to the embodiments. The data DQ may be set to include a plurality of data which are successively transmitted according to the embodiments. The set period may be set to be a write latency period for an alignment operation of the data DQ. The set period will be described later. Referring to FIG. 1, the first semiconductor device 1 may output the commands CMD<1:N>, the addresses ADD<1:M>, the data DQ and the strobe signal DQS during the initialization operation. However, during a read operation, the first semiconductor device 1 may be realized to output the commands CMD<1:N>, the addresses ADD<1:M> and the strobe signal DQS to the second semiconductor device 2 as well as to receive the data DQ from the second semiconductor device 2.

The first semiconductor device 1 may transmit the data DQ to the second semiconductor device 2 through a data bus. The first semiconductor device 1 may stop transmitting the data DQ to the second semiconductor device 2 during the initialization operation. The first semiconductor device 1 may transmit the strobe signal DQS to the second semiconductor device 2. The strobe signal DQS may not be toggled during the initialization operation. The first semiconductor device 1 may calculate a write recovery time tWR from a clock signal (not illustrated) while the initialization operation is performed. The write recovery time tWR may be set to a time period from a point of time that the last data of the data DQ is outputted from the first semiconductor device 1 till a point of time that a pre-charge operation is performed.

The command decoder 10 may decode the commands CMD<1:N> to generate a write signal WT and an initialization signal WTZ. The command decoder 10 may generate the write signal WT which is enabled if the commands CMD<1:N> have a first combination. The command decoder 10 may generate the initialization signal WTZ which is enabled if the commands CMD<1:N> have a second combination. The command decoder 10 may generate the write signal WT and the initialization signal WTZ which are sequentially enabled according to combinations of the commands CMD<1:N>. The write signal WT may be set to be a signal for storing the data DQ in the memory circuit 40 in synchronization with the strobe signal DQS during the initialization operation. The initialization signal WTZ may be set to be a signal for storing internal data ID having a level of an external voltage into the memory circuit 40 regardless of the data DQ and the strobe signal DQS during the initialization operation.

The internal strobe signal generation circuit 20 may generate a first internal strobe signal WTS which is enabled in response to the write signal WT and may generate a second internal strobe signal WTZS which is enabled in response to the initialization signal WTZ. The internal strobe signal generation circuit 20 may generate the first internal strobe signal WTS which enabled after the set period in response to the write signal WT. The internal strobe signal generation circuit 20 may generate the second internal strobe signal WTZS which is enabled in response to the initialization signal WTZ.

The I/O circuit 30 may output the data DQ or the external voltage as the internal data ID in response to the first internal strobe signal WTS or the second internal strobe signal WTZS. The I/O circuit 30 may output the data DQ synchronized with the strobe signal DQS as the internal data ID in response to the first internal strobe signal WTS. The I/O circuit 30 may output the external voltage as the internal data ID in response to the second internal strobe signal WTZS. The external voltage may be a power supply voltage VDD or a ground voltage VSS.

The memory circuit 40 may include memory cells and may store the internal data ID into the memory cells selected by the addresses ADD<1:M> during the initialization operation. The memory circuit 40 may output the internal data ID stored in the memory cells selected by the addresses ADD<1:M> during the initialization operation. The memory circuit 40 may be realized to include a nonvolatile memory device having a memory cell array or a volatile memory device having a memory cell array.

The second semiconductor device 2 may start to perform the initialization operation if the commands CMD<1:N> have the first combination, may store the internal data ID having a predetermined level during a set period of the initialization operation if the commands CMD<1:N> have the second combination, and may store the internal data ID corresponding to the data DQ in synchronization with the strobe signal DQS after the set period. The second semiconductor device 2 may output the internal data ID as the data DQ during the initialization operation.

The second semiconductor device 2 according to an embodiment may include an on-die termination (ODT) circuit (i.e., see FIG. 9) for preventing distortion of the data DQ. The ODT circuit may not be turned on during the initialization operation.

Figure 2:
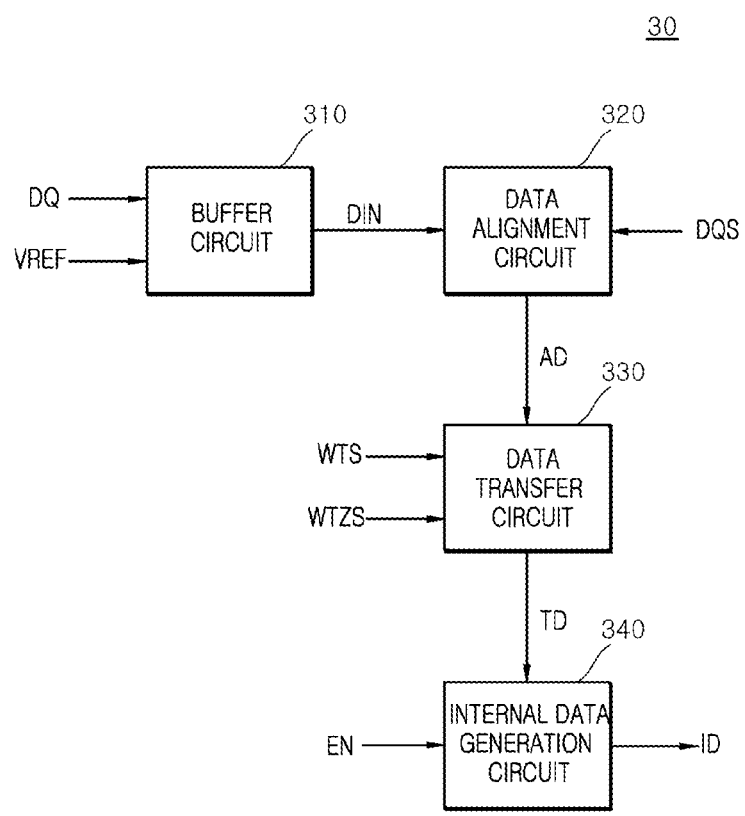
FIG. 2 is a block diagram illustrating a representation of an example of a configuration of an input/output (I/O) circuit included in the semiconductor system of FIG. 1.

Referring to FIG. 2, the I/O circuit 30 may include a buffer circuit 310, a data alignment circuit 320, a data transfer circuit 330 and an internal data generation circuit 340.

The buffer circuit 310 may compare the data DQ with a reference voltage VREF to generate input data DIN. The buffer circuit 310 may be realized using a general comparator and may buffer the data DQ to generate the input data DIN. The reference voltage VREF may be set to have a certain level for detecting a logic level of the data DQ. The buffer circuit 310 may be realized using an input buffer as shown in FIG. 1 of Pub No. US 2004/0090242.

The data alignment circuit 320 may align the input data DIN in synchronization with the strobe signal DQS to generate aligned data AD. The data alignment circuit 320 may latch the input data DIN in synchronization with rising edges and falling edges of the strobe signal DQS and may align the latched input data DIN to generate the aligned data AD. The input data DIN may be set to have a plurality of bits according to the embodiments. The input data DIN may be set to include a plurality of data which are successively transmitted according to the embodiments. A time period for aligning the input data DIN to generate the aligned data AD may be set to correspond to the write latency period described above. The data alignment circuit 320 may be realized using a data alignment circuit 133 as shown in FIG. 2 of U.S. Pat. No. 9,449,665.

The data transfer circuit 330 may output the aligned data AD as transferred data TD in response to the first internal strobe signal WTS. The data transfer circuit 330 may output the external voltage as the transferred data TD in response to the second internal strobe signal WTZS.

Figure 3:
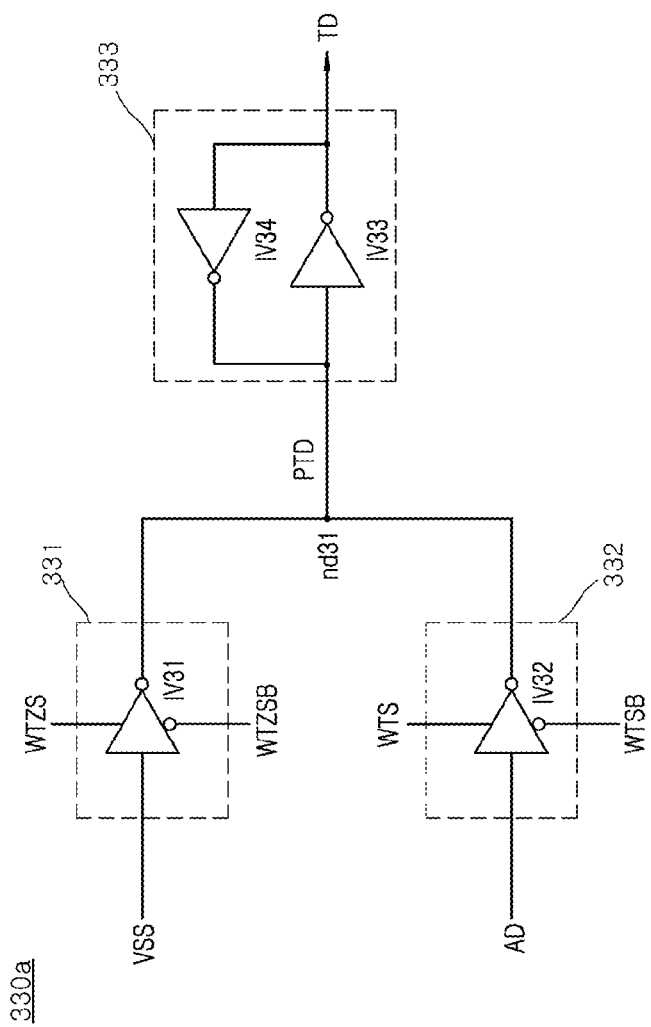
FIG. 3 is a circuit diagram illustrating a representation of a configuration of an example of a data transfer circuit included in the input/output (I/O) circuit of FIG. 2.

The internal data generation circuit 340 may drive the internal data ID in response to the transferred data TD if an enablement signal EN is enabled. The enablement signal EN may be enabled when the initialization operation is performed. The internal data generation circuit 340 may be realized using a write driver 140 as shown in FIG. 3 of U.S. Pat. No. 7,656,722.

Referring to FIG. 3, a data transfer circuit 330a corresponding to an example of the data transfer circuit 330 of FIG. 2 may include a first transfer circuit 331, a second transfer circuit 332 and a first latch circuit 333.

The first transfer circuit 331 may be realized using an inverter IV31 and may inversely buffer the ground voltage VSS to output the inversely buffered voltage of the ground voltage VSS to a node nd31 in response to the second internal strobe signal WTZS and a second inverted internal strobe signal WTZSB. The inverter IV31 may be realized using a tri-state inverter. Thus, the inverter IV31 may inversely buffer the ground voltage VSS to output the inversely buffered voltage of the ground voltage VSS to the node nd31 if the second internal strobe signal WTZS has a logic "high" level and the second inverted internal strobe signal WTZSB has a logic "low" level. The first transfer circuit 331 may pull up the node nd31 in response to the ground voltage VSS to generate a pre-transferred data PTD if the second internal strobe signal WTZS has a logic "high" level and the second inverted internal strobe signal WTZSB has a logic "low" level. The second inverted internal strobe signal WTZSB may be a complementary signal of the second internal strobe signal WTZS.

The second transfer circuit 332 may be realized using an inverter IV32 and may inversely buffer the aligned data AD to output the inversely buffered data of the aligned data AD to the node nd31 in response to the first internal strobe signal WTS and a first inverted internal strobe signal WTSB. The inverter IV32 may be realized using a tri-state inverter. Thus, the inverter IV32 may inversely buffer the aligned data AD to output the inversely buffered data of the aligned data AD to the node nd31 if the first internal strobe signal WTS has a logic "high" level and the first inverted internal strobe signal WTSB has a logic "low" level. The second transfer circuit 332 may inversely buffer the aligned data AD to generate the pre-transferred data PTD if the first internal strobe signal WTS has a logic "high" level and the first inverted internal strobe signal WTSB has a logic "low" level. The first inverted internal strobe signal WTSB may be a complementary signal of the first internal strobe signal WTS.

The first latch circuit 333 may inversely buffer and latch a signal of the node nd31 to generate the transferred data TD. The first latch circuit 333 may inversely buffer and latch the pre-transferred data PTD to generate the transferred data TD. The first latch circuit 333 may be realized using a general latch circuit comprised of inverters IV33 and IV34.

Figure 4:
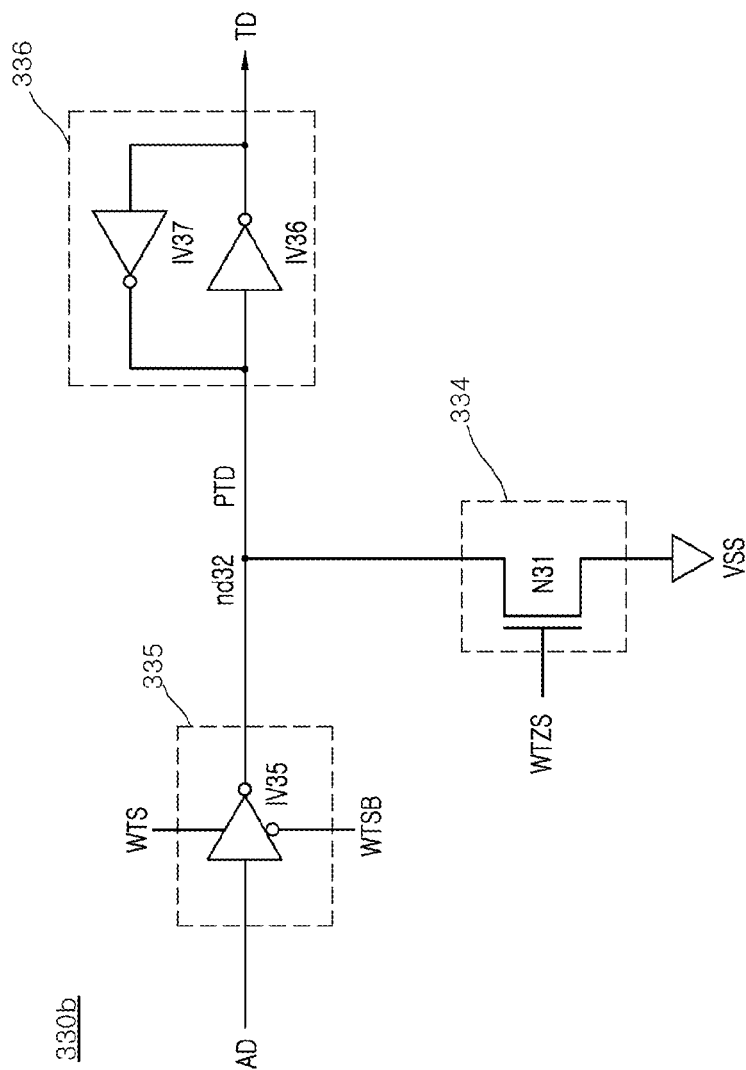
FIG. 4 is a circuit diagram illustrating a representation of a configuration of an example of a data transfer circuit included in the input/output (I/O) circuit of FIG. 2.

Referring to FIG. 4, a data transfer circuit 330b corresponding to an example of the data transfer circuit 330 of FIG. 2 may include a first driving circuit 334, a third transfer circuit 335 and a second latch circuit 336.

The first driving circuit 334 may be realized using an NMOS transistor N31 coupled between a node nd32 and a ground voltage VSS terminal and may electrically connect the node nd32 to the ground voltage VSS terminal in response to the second internal strobe signal WTZS. The NMOS transistor N31 of the first driving circuit 334 may be turned on to electrically connect the node nd32 to the ground voltage VSS terminal, if the second internal strobe signal WTZS has a logic "high" level. The NMOS transistor N31 of the first driving circuit 334 may be turned on to discharge electric charges of the node nd32 into the ground voltage VSS terminal, if the second internal strobe signal WTZS has a logic "high" level. The NMOS transistor N31 of the first driving circuit 334 may pull down a level of the node nd32 to generate the pre-transferred data PTD having a level of the ground voltage VSS, if the second internal strobe signal WTZS has a logic "high" level.

The third transfer circuit 335 may be realized using an inverter IV35 and may inversely buffer the aligned data AD to output the inversely buffered data of the aligned data AD to the node nd32 in response to the first internal strobe signal WTS and the first inverted internal strobe signal WTSB. The inverter IV35 may be realized using a tri-state inverter. Thus, the inverter IV35 may inversely buffer the aligned data AD to output the inversely buffered data of the aligned data AD to the node nd32 if the first internal strobe signal WTS has a logic "high" level and the first inverted internal strobe signal WTSB has a logic "low" level. The third transfer circuit 335 may inversely buffer the aligned data AD to generate the pre-transferred data PTD if the first internal strobe signal WTS has a logic "high" level and the first inverted internal strobe signal WTSB has a logic "low" level. The first inverted internal strobe signal WTSB may be a complementary signal of the first internal strobe signal WTS.

The second latch circuit 336 may inversely buffer and latch a signal of the node nd32 to generate the transferred data TD. The second latch circuit 336 may inversely buffer and latch the pre-transferred data PTD to generate the transferred data TD. The second latch circuit 336 may be realized using a general latch circuit comprised of inverters IV36 and IV37.

Figure 5:
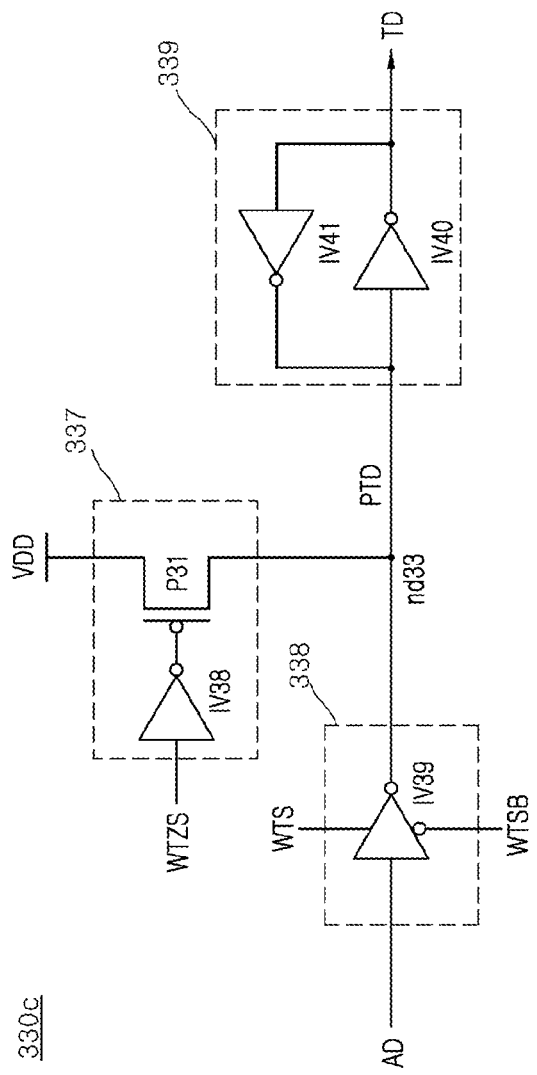
FIG. 5 is a circuit diagram illustrating a representation of a configuration of an example of a data transfer circuit included in the input/output (I/O) circuit of FIG. 2.
Figure 6:
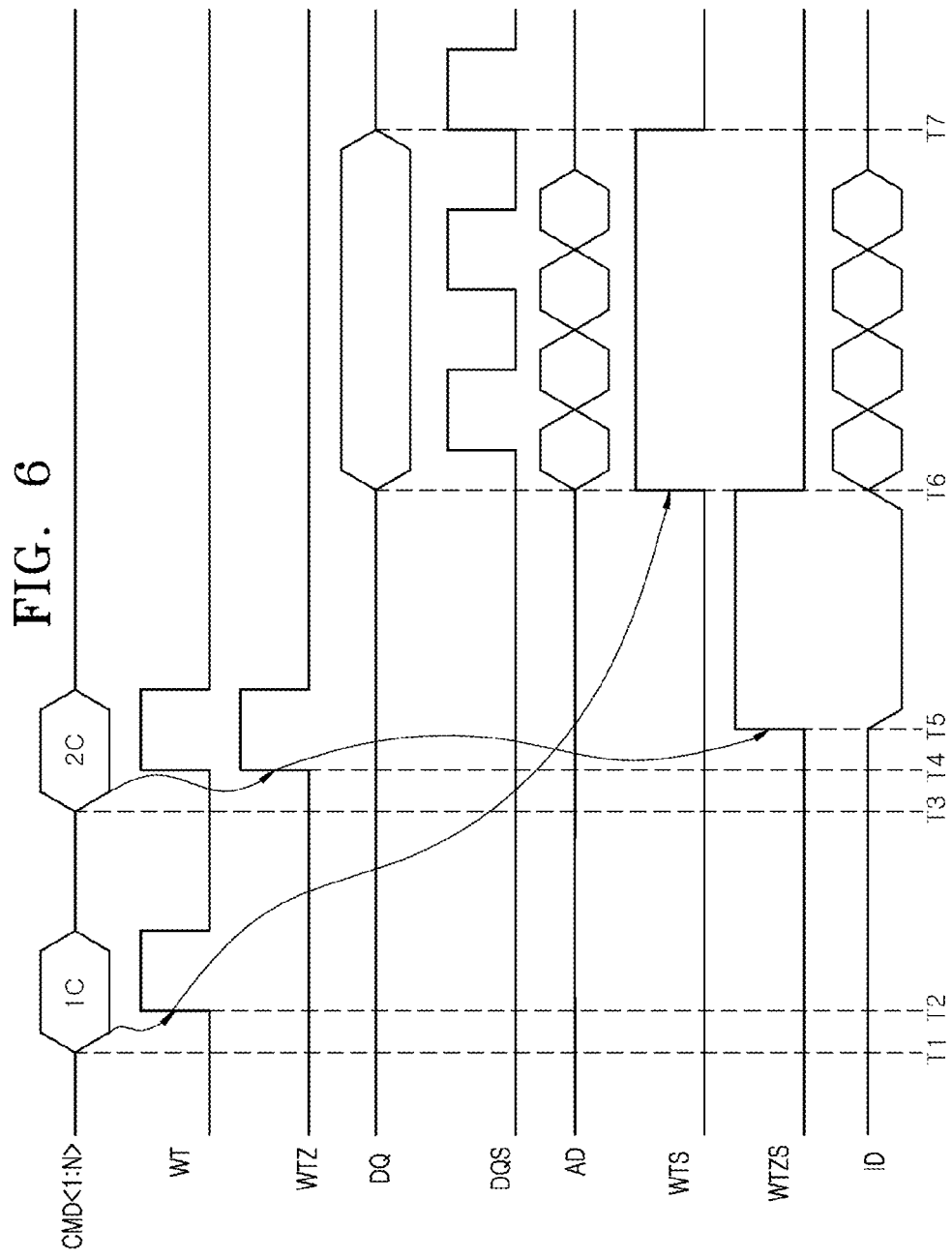
FIG. 6 is a timing diagram illustrating a representation of an example of an operation of a semiconductor system according to an embodiment.

Referring to FIG. 5, a data transfer circuit 330c corresponding to an example of the data transfer circuit 330 of FIG. 2 may include a second driving circuit 337, a fourth transfer circuit 338 and a third latch circuit 339.

The second driving circuit 337 may be realized to include an inverter IV38 and a PMOS transistor P31. The inverter IV38 may inversely buffer the second internal strobe signal WTZS. The PMOS transistor P31 may be coupled between a power supply voltage VDD terminal and a node nd33 and may be turned on in response to an output signal of the inverter IV38. The second driving circuit 337 may electrically connect the node nd33 to the power supply voltage VDD terminal in response to the second internal strobe signal WTZS. The PMOS transistor P31 of the second driving circuit 337 may be turned on to electrically connect the node nd33 to the power supply voltage VDD terminal, if the second internal strobe signal WTZS has a logic "high" level. The PMOS transistor P31 of the second driving circuit 337 may be turned on to supply electric charges of the power supply voltage VDD terminal to the node nd33, if the second internal strobe signal WTZS has a logic "high" level. The second driving circuit 337 may pull up a level of the node nd33 to generate the pre-transferred data PTD having a level of the power supply voltage VDD, if the second internal strobe signal WTZS has a logic "high" level.

The fourth transfer circuit 338 may be realized using an inverter IV39 and may inversely buffer the aligned data AD to output the inversely buffered data of the aligned data AD to the node nd33 in response to the first internal strobe signal WTS and the first inverted internal strobe signal WTSB. The inverter IV39 may be realized using a tri-state inverter. Thus, the inverter IV39 may inversely buffer the aligned data AD to output the inversely buffered data of the aligned data AD to the node nd33 if the first internal strobe signal WTS has a logic "high" level and the first inverted internal strobe signal WTSB has a logic "low" level. The fourth transfer circuit 338 may inversely buffer the aligned data AD to generate the pre-transferred data PTD if the first internal strobe signal WTS has a logic "high" level and the first inverted internal strobe signal WTSB has a logic "low" level. The first inverted internal strobe signal WTSB may be a complementary signal of the first internal strobe signal WTS.

The third latch circuit 339 may inversely buffer and latch a signal of the node nd33 to generate the transferred data TD. The third latch circuit 339 may inversely buffer and latch the pre-transferred data PTD to generate the transferred data TD. The third latch circuit 339 may be realized using a general latch circuit comprised of inverters IV40 and IV41.

An operation of the semiconductor system having an aforementioned configuration will be described hereinafter with reference to FIGS. 1 to 6 in conjunction with an operation that generates the internal data ID having a level of the external voltage during a set period of the initialization operation starts and generates the internal data ID from the data DQ after the set period.

At a point of time "T1", the first semiconductor device 1 may output the commands CMD<1:N> having a first combination 1C and the addresses ADD<1:M>. In addition, the first semiconductor device 1 may output the data DQ having a logic "low" level and the strobe signal DQS having a logic "low" level.

At a point of time "T2", the command decoder 10 may decode the commands CMD<1:N> having the first combination 1C to generate the write signal WT which enabled to have a logic "high" level.

At a point of time "T3", the first semiconductor device 1 may output the commands CMD<1:N> having a second combination 2C and the addresses ADD<1:M>. In addition, the first semiconductor device 1 may output the data DQ having a logic "low" level and the strobe signal DQS having a logic "low" level.

At a point of time "T4", the command decoder 10 may decode the commands CMD<1:N> having the second combination 2C to generate the initialization signal WTZ which enabled to have a logic "high" level.

From a point of time "T5" till a point of time "T6", the internal strobe signal generation circuit 20 may generate the second internal strobe signal WTZS which is enabled to have a logic "high" level in response to the initialization signal WTZ having a logic "high" level.

The data transfer circuit 330 of the I/O circuit 30 may output the external voltage as the internal data ID in response to the second internal strobe signal WTZS having a logic "high" level. In such a case, the external voltage may be set to correspond to the ground voltage VSS.

The internal data generation circuit 340 of the I/O circuit 30 may generate the internal data ID having a logic "low" level in response to the enablement signal EN having a logic "high" level and the transferred data TD having a logic "low" level.

At the point of time "T6", the first semiconductor device 1 may output the data DQ and the strobe signal DQS toggled after the set period.

From the point of time "T6" till a point of time "T7", the internal strobe signal generation circuit 20 may generate the first internal strobe signal WTS which is enabled to have a logic "high" level after the set period in response to the write signal WT.

At the point of time "T6", the buffer circuit 310 of the I/O circuit 30 may compare the data DQ with the reference voltage VREF to generate the input data DIN.

The data alignment circuit 320 of the I/O circuit 30 may align the input data DIN in synchronization with the strobe signal DQS toggled after the set period to generate the aligned data AD. The data alignment circuit 320 may align the input data DIN in synchronization with rising edges and falling edges of the strobe signal DQS to generate the aligned data AD.

The data transfer circuit 330 of the I/O circuit 30 may output the aligned data AD as the transferred data TD in response to the first internal strobe signal WTS having a logic "high" level.

The internal data generation circuit 340 of the I/O circuit 30 may generate the internal data ID in response to the enablement signal EN having a logic "high" level and the transferred data TD.

The semiconductor system described above may initialize memory cells by internally storing the internal data having a level of the external voltage in the memory cells while the initialization operation is performed according to a combination of the commands, regardless of the data and the strobe signal. In addition, the semiconductor system may stop transmitting the data and toggling the strobe signal during the initialization operation. Thus, power consumption of the semiconductor system may be reduced.

Figure 7:
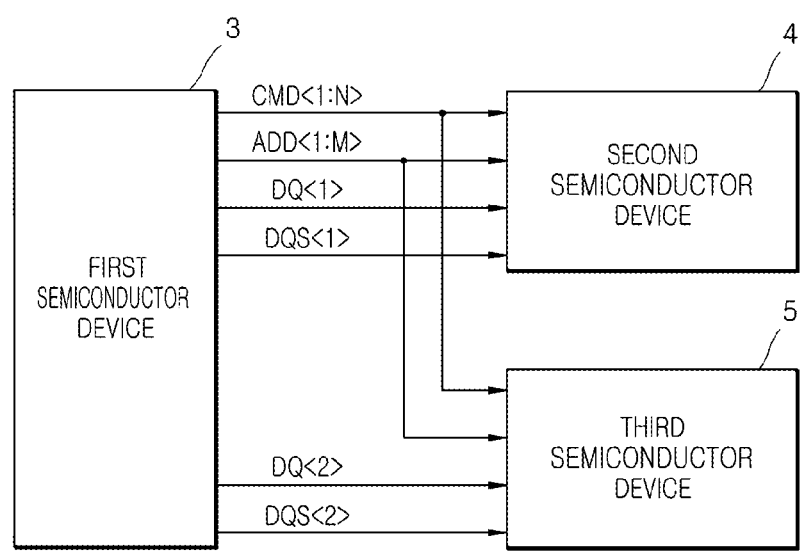
FIG. 7 is a block diagram illustrating a representation of an example of a configuration of a semiconductor system according to an embodiment.

Referring to FIG. 7, a semiconductor system according to an embodiment may include a first semiconductor device 3, a second semiconductor device 4 and a third semiconductor device 5.

The first semiconductor device 3 may output commands CMD<1:N>, addresses ADD<1:M>, first and second data DQ<1:2>, and first and second strobe signals DQS<1:2>. The first semiconductor device 3 may output the first and second data DQ<1:2> after a set period of an initialization operation. The first semiconductor device 3 may output the first and second strobe signals DQS<1:2> which are toggled after the set period of the initialization operation. The number "N" of bits of the commands CMD<1:N> may be set to be a natural number and may be set to be different according to the embodiments. The number "M" of bits of the addresses ADD<1:M> may be set to be a natural number and may be set to be different according to the embodiments. Each of the first and second data DQ<1:2> may be set to include a plurality of data which are successively transmitted according to the embodiments. The set period may be set to be a write latency period for an alignment operation of the first data DQ<1> or the second data DQ<2>.

In some embodiments, the first semiconductor device 3 may transmit the first data DQ<1> and the second data DQ<2> to the second semiconductor device 4 and the third semiconductor device 5 through data buses. The first semiconductor device 3 may stop transmitting the first and second data DQ<1:2> to the second and third semiconductor devices 4 and 5 during the initialization operation. The first semiconductor device 3 may transmit the first strobe signal DQS<1> and the second strobe signal DQS<2> to the second semiconductor device 4 and the third semiconductor device 5. The first and second strobe signals DQS<1:2> may not be toggled during the initialization operation. The first semiconductor device 3 may calculate a write recovery time tWR from a clock signal (not illustrated) while the initialization operation is performed. The write recovery time tWR may be set to be a time period from a point of time that the last data of the first data DQ<1> or the second data DQ<2> is outputted from the first semiconductor device 1 till a point of time that a pre-charge operation is performed.

The second semiconductor device 4 may start to perform the initialization operation if the commands CMD<1:N> have a first combination, may store first internal data (not illustrated) having a predetermined level during a set period of the initialization operation if the commands CMD<1:N> have a second combination, and may store the first internal data (not illustrated) corresponding to the first data DQ<1> in synchronization with the first strobe signal DQS<1> after the set period. The second semiconductor device 4 may output the first internal data as the first data DQ<1> during the initialization operation. The second semiconductor device 4 may be realized to have the same configuration as the second semiconductor device 2 illustrated in FIG. 1 and to perform the same operation as second semiconductor device 2 illustrated in FIG. 1. Thus, a description of the second semiconductor device 4 will be omitted hereinafter.

In some embodiments, the second semiconductor device 4 may include an on-die termination (ODT) circuit (i.e., see FIG. 9) for preventing distortion of the first data DQ<1>. The ODT circuit may not be turned on during the initialization operation.

The third semiconductor device 5 may start to perform the initialization operation if the commands CMD<1:N> have the first combination, may store second internal data (not illustrated) having a predetermined level during the set period of the initialization operation if the commands CMD<1:N> have the second combination, and may store the second internal data (not illustrated) corresponding to the second data DQ<2> in synchronization with the second strobe signal DQS<2> after the set period. The third semiconductor device 5 may output the second internal data as the second data DQ<2> during the initialization operation. The third semiconductor device 5 may be realized to have the same configuration as the second semiconductor device 2 illustrated in FIG. 1 and to perform the same operation as second semiconductor device 2 illustrated in FIG. 1. Thus, a description of the third semiconductor device 5 will be omitted hereinafter. The third semiconductor device 5 may be realized to perform an operation that stores second internal data (not illustrated) corresponding to the second data DQ<2> in synchronization with the second strobe signal DQS<2> while the second semiconductor device 4 stores the first internal data (not illustrated) having a level of an external voltage. The third semiconductor device 5 may be realized to perform an operation that stores the second internal data (not illustrated) having a level of the external voltage while the second semiconductor device 4 stores the first internal data (not illustrated) corresponding to the first data DQ<1> in synchronization with first strobe signal DQS<1>.

In some embodiments, the third semiconductor device 5 may include an on-die termination (ODT) circuit (i.e., see FIG. 9) for preventing distortion of the second data DQ<2>. The ODT circuit may not be turned on during the initialization operation.

The semiconductor system according to an embodiment may initialize memory cells by internally storing the internal data having a level of the external voltage in the memory cells while the initialization operation is performed according to a combination of the commands, regardless of the data and the strobe signal. In addition, the semiconductor system may stop transmitting the data and toggling the strobe signal during the initialization operation. Thus, power consumption of the semiconductor system may be reduced.

Figure 8:
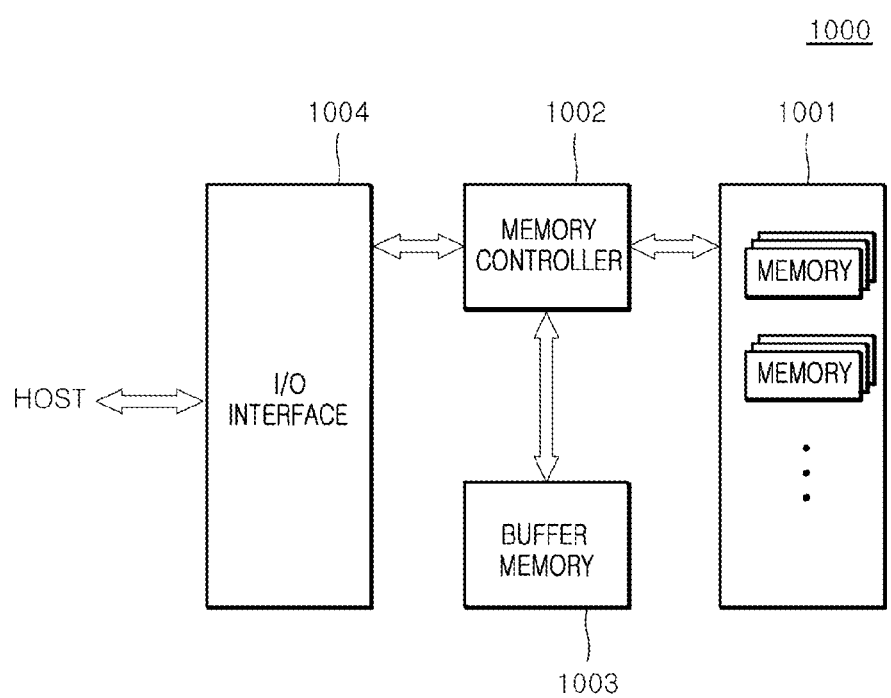
FIG. 8 is a block diagram illustrating a representation of an example of a configuration of an electronic system employing the semiconductor device or the semiconductor system illustrated in FIGS. 1 to 7.

The semiconductor devices or the semiconductor systems described with reference to FIGS. 1 to 7 may be applied to an electronic system that includes a memory system, a graphic system, a computing system, a mobile system, or the like. For example, as illustrated in FIG. 8, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the second semiconductor devices 2 illustrated in FIG. 1, the second semiconductor devices 4 illustrated in FIG. 7, or the third semiconductor devices 5 illustrated in FIG. 7. The data storage circuit 1001 may generate internal data having a logic level which is internally set regardless of logic levels of external data and may perform an initialization operation that stores the internal data in a memory cell array included in the data storage circuit 1001. The data storage circuit 1001 may include an ODT circuit (i.e., see FIG. 9) for preventing distortion of data. The ODT circuit may be designed not to operate during the initialization operation of the data storage circuit 1001. The data storage circuit 1001 may also include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 and the buffer memory 1003 or for outputting the data stored in the data storage circuit 1001 and the buffer memory 1003. The memory controller 1002 may include the first semiconductor devices 1 illustrated in FIG. 1 or the first semiconductor devices 3 illustrated in FIG. 7. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 8 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 9:
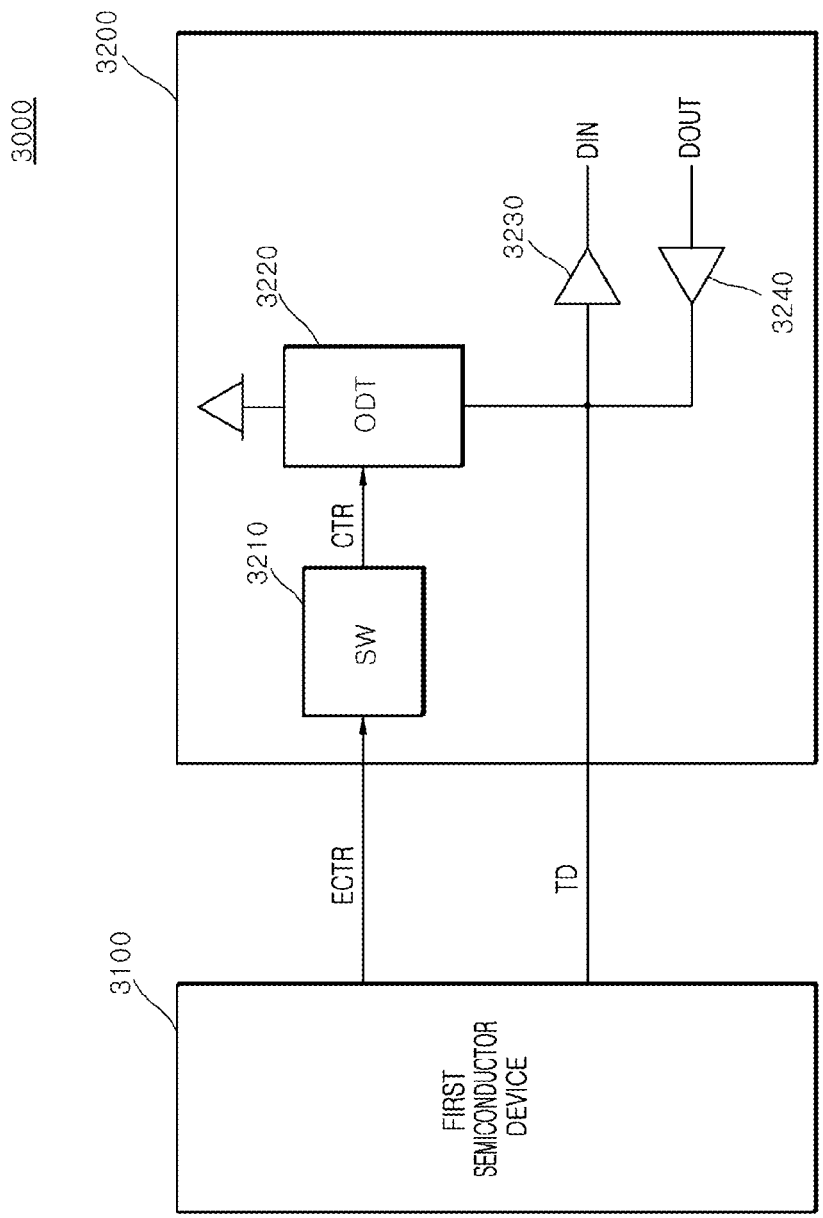
FIG. 9 is a block diagram illustrating a representation of an example of a configuration of an electronic system employing the semiconductor device or the semiconductor system illustrated in FIGS. 1 to 7.

The semiconductor devices or the semiconductor systems described with reference to FIGS. 1 to 7 may be applied to another electronic system that includes a memory system, a graphic system, a computing system, a mobile system, or the like. For example, as illustrated in FIG. 9, an electronic system 3000 according an embodiment may include a first semiconductor device 3100 and a second semiconductor device 3200.

The first semiconductor device 3100 may apply an external control signal ECTR for controlling an ODT circuit 3220 included in the second semiconductor device 3200 to the second semiconductor device 3200. The first semiconductor device 3100 may not apply the external control signal ECTR to the second semiconductor device 3200 during an initialization operation of the second semiconductor device 3200. The first semiconductor device 3100 may apply transferred data TD to the second semiconductor device 3200.

The second semiconductor device 3200 may include a switch (SW) 3210, the ODT circuit 3220, an input buffer 3230 and an output buffer 3240. The switch (SW) 3210 may receive the external control signal ECTR and may output the external control signal ECTR as a control signal CTR. The ODT circuit 3220 may be turned on in response to the control signal CTR. The ODT circuit 3220 may be turned off during the initialization operation of the second semiconductor device 3200. The input buffer 3230 may receive the transferred data TD to generate input data DIN during a write operation. The input data DIN may store in memory cells (not illustrated) included in the second semiconductor device 3200 during the write operation. The output buffer 3240 may receive output data DOUT and may output the output data DOUT as the transferred data TD, during a read operation. The output data DOUT may be outputted from the memory cells (not illustrated) included in the second semiconductor device 3200 during the read operation.

What is claimed is:

1. A semiconductor system comprising:
a first semiconductor device configured to output commands and addresses and configured to output a strobe signal toggled and data after an initialization operation; and
a second semiconductor device configured to start the initialization operation if the commands have a first combination and configured to store internal data having a predetermined level during a set period of the initialization operation if the commands have a second combination.

2. The semiconductor system of claim 1, wherein the set period is set to be a write latency period for an alignment operation of the data.

3. The semiconductor system of claim 1, wherein the second semiconductor device stores the internal data corresponding to the data in synchronization with the strobe signal after the set period.

4. The semiconductor system of claim 1, wherein the second semiconductor device outputs the internal data as the data during the initialization operation.

5. The semiconductor system of claim 1, wherein the first semiconductor device is configured to calculate a write recovery time while the initialization operation is performed.

6. The semiconductor system of claim 5, wherein the write recovery time is set to a time period from a point of time that a last data of the data is outputted from the first semiconductor device till a point of time that a pre-charge operation is performed.

7. The semiconductor system of claim 1, wherein the second semiconductor device includes:
a command decoder configured to generate a write signal which is enabled if the commands have the first combination and configured to generate an initialization signal which is enabled if the commands have the second combination;
an internal strobe signal generation circuit configured to generate a first internal strobe signal which is enabled after the set period based on the write signal and configured to generate a second internal strobe signal which is enabled based on the initialization signal;
an input/output (I/O) circuit configured to output an external voltage as the internal data based on the second internal strobe signal and configured to output the data synchronized with the strobe signal as the internal data based on the first internal strobe signal; and
a memory circuit configured to store the internal data into memory cells selected by the addresses.

8. The semiconductor system of claim 7, wherein the I/O circuit includes:
a data transfer circuit configured to output aligned data as transferred data based on the first internal strobe signal and configured to output the external voltage as the transferred data based on the second internal strobe signal; and
an internal data generation circuit configured to drive the internal data based on the transferred data if an enablement signal is enabled during the initialization operation.

9. The semiconductor system of claim 8, wherein the external voltage is a ground voltage or a power supply voltage.

10. The semiconductor system of claim 9, wherein the data transfer circuit includes:
a first transfer circuit configured to inversely buffer the ground voltage to output the inversely buffered voltage of the ground voltage to a node based on the second internal strobe signal;
a second transfer circuit configured to inversely buffer the aligned data to output the inversely buffered data of the aligned data to the node based on the first internal strobe signal; and
a latch circuit configured to inversely buffer and latch a signal of the node to generate the transferred data.

11. The semiconductor system of claim 9, wherein the data transfer circuit includes:
a driving circuit configured to drive a node to a level of the ground voltage based on the second internal strobe signal;
a transfer circuit configured to inversely buffer the aligned data to output the inversely buffered data of the aligned data to the node based on the first internal strobe signal; and
a latch circuit configured to inversely buffer and latch a signal of the node to generate the transferred data.

12. The semiconductor system of claim 9, wherein the data transfer circuit includes:
- a driving circuit configured to drive a node to a level of the power supply voltage based on the second internal strobe signal;
- a transfer circuit configured to inversely buffer the aligned data to output the inversely buffered data of the aligned data to the node based on the first internal strobe signal; and
- a latch circuit configured to inversely buffer and latch a signal of the node to generate the transferred data.

13. The semiconductor system of claim 8, wherein the I/O circuit further includes:
- a buffer circuit configured to compare the data with a reference voltage to generate input data; and
- a data alignment circuit configured to latch the input data in synchronization with the strobe signal and configured to align the latched data of the input data to generate the aligned data.

14. A semiconductor device comprising:
- a command decoder configured to generate a write signal and an initialization signal which are enabled based on commands during an initialization operation;
- an internal strobe signal generation circuit configured to generate a first internal strobe signal which is enabled after a set period based on the write signal and configured to generate a second internal strobe signal which is enabled based on the initialization signal; and
- an input/output (I/O) circuit configured to generate internal data having a predetermined level based on the second internal strobe signal and configured to generate the internal data from data in synchronization with a strobe signal which is toggled after the set period.

15. The semiconductor device of claim 14, wherein the write signal and the initialization signal are sequentially enabled according to combinations of the commands.

16. The semiconductor device of claim 14, wherein the semiconductor device outputs the internal data as the data during the initialization operation.

17. The semiconductor device of claim 14, wherein the set period is set to be a write latency period for an alignment operation of the data.

18. The semiconductor device of claim 14,
- wherein the I/O circuit is configured to drive the internal data to the predetermined level during the set period; and
- wherein the predetermined level is a level of an external voltage.

19. The semiconductor device of claim 14, wherein the I/O circuit includes:
- a data transfer circuit configured to output aligned data as transferred data based on the first internal strobe signal and configured to output the external voltage as the transferred data based on the second internal strobe signal; and
- an internal data generation circuit configured to drive the internal data based on the transferred data if an enablement signal is enabled during the initialization operation.

20. The semiconductor device of claim 19, wherein the external voltage is a ground voltage or a power supply voltage.

21. The semiconductor device of claim 20, wherein the data transfer circuit includes:
- a first transfer circuit configured to inversely buffer the ground voltage to output the inversely buffered voltage of the ground voltage to a node based on the second internal strobe signal;
- a second transfer circuit configured to inversely buffer the aligned data to output the inversely buffered data of the aligned data to the node based on the first internal strobe signal; and
- a latch circuit configured to inversely buffer and latch a signal of the node to generate the transferred data.

22. The semiconductor device of claim 20, wherein the data transfer circuit includes:
- a driving circuit configured to drive a node to a level of the ground voltage based on the second internal strobe signal;
- a transfer circuit configured to inversely buffer the aligned data to output the inversely buffered data of the aligned data to the node based on the first internal strobe signal; and
- a latch circuit configured to inversely buffer and latch a signal of the node to generate the transferred data.

23. The semiconductor device of claim 20, wherein the data transfer circuit includes:
- a driving circuit configured to drive a node to a level of the power supply voltage based on the second internal strobe signal;
- a transfer circuit configured to inversely buffer the aligned data to output the inversely buffered data of the aligned data to the node based on the first internal strobe signal; and
- a latch circuit configured to inversely buffer and latch a signal of the node to generate the transferred data.

24. The semiconductor device of claim 19, wherein the I/O circuit further includes:
- a buffer circuit configured to compare the data with a reference voltage to generate input data; and
- a data alignment circuit configured to latch the input data in synchronization with the strobe signal and configured to align the latched data of the input data to generate the aligned data.

25. A semiconductor system comprising:
- a first semiconductor device configured to output commands and addresses and configured to output first and second strobe signals toggled and first and second data after an initialization operation;
- a second semiconductor device configured to start the initialization operation if the commands have a first combination, configured to store first internal data having a predetermined level during a set period of the initialization operation if the commands have a second combination, and configured to store the first internal data corresponding to the first data in synchronization with the first strobe signal after the set period; and
- a third semiconductor device configured to start the initialization operation if the commands have the first combination, configured to store second internal data having a predetermined level during the set period of the initialization operation if the commands have the second combination, and configured to store the second internal data corresponding to the second data in synchronization with the second strobe signal after the set period.

26. A semiconductor device comprising:
- a command decoder configured to generate a write signal based on commands having a first combination, and configured to generate an initialization signal based on commands having a second combination, wherein the write signal is a signal for storing data in synchronization with a strobe signal during an initialization operation, and wherein the initialization signal is a signal for storing internal data having a level of an external voltage regardless of the data and the strobe signal during the initialization operation.

27. The semiconductor device of claim 26, wherein the write signal and the initialization signal are sequentially enabled according to the combinations of the first and second commands.

\* \* \* \* \*